United States Patent
Yang (10) Patent No.: US 11,082,037 B2
(45) Date of Patent: Aug. 3, 2021

(54) DUTY CYCLE CORRECTION CIRCUIT

(71) Applicant: SHENZHEN GOODIX TECHNOLOGY CO., LTD., Shenzhen (CN)

(72) Inventor: Boxin Yang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/127,487

(22) Filed: Dec. 18, 2020

(65) Prior Publication Data

US 2021/0159894 A1 May 27, 2021

Related U.S. Application Data (63) Continuation of application No. PCT/CN2019/120236, filed on Nov. 22, 2019.

(51) Int. Cl.
*H03K 5/15* (2006.01)
*H03K 5/156* (2006.01)
*H03K 19/0185* (2006.01)
*H03K 5/00* (2006.01)

(52) U.S. Cl.
CPC ... *H03K 5/1565* (2013.01); *H03K 19/018521* (2013.01); *H03K 2005/00032* (2013.01)

(58) Field of Classification Search
CPC ......... H03K 5/1565; H03K 19/018521; H03K 2005/00032
See application file for complete search history.

(56) References Cited

U.S. PATENT DOCUMENTS

| | | | | |
|---|---|---|---|---|
| 6,452,432 B2 * | 9/2002 | Kim | ...................... | H03L 7/0816 327/158 |
| 7,046,059 B2 * | 5/2006 | Kwak | .................... | H03L 7/0812 327/158 |
| 8,502,583 B2 * | 8/2013 | Kim | ...................... | H03K 5/1565 327/175 |
| 8,736,329 B1 * | 5/2014 | Rajavi | .................. | H03K 5/1565 327/172 |
| 2006/0267649 A1 | 11/2006 | Park et al. | | |
| 2009/0261877 A1 | 10/2009 | Huang et al. | | |
| 2013/0106479 A1 | 5/2013 | Kim et al. | | |

FOREIGN PATENT DOCUMENTS

| | | |
|---|---|---|
| CN | 101478300 A | 7/2009 |
| CN | 104124945 A | 10/2014 |
| CN | 108832915 A | 11/2018 |

* cited by examiner

*Primary Examiner* — Dinh T Le
(74) *Attorney, Agent, or Firm* — Brion Raffoul (57) ABSTRACT

A duty cycle correction circuit includes: a first inverter, a first delayer, and a first adjustment circuit. An input terminal and output terminal of the first inverter are respectively configured to receive a first signal and output a third signal. A first input terminal and an output terminal of the first adjustment circuit are respectively configured to receive the third signal and output a first correction signal. An input terminal and output terminal of the first delayer are respectively configured to input a second signal and output a fourth signal to the first adjustment circuit. The fourth signal has a first delay time relative to the second signal. When the third signal and the fourth signal are at a high level, so is the first correction signal. When the third signal and the fourth signal are at a low level, so is the first correction signal.

15 Claims, 6 Drawing Sheets

DUTY CYCLE CORRECTION CIRCUIT

CROSS REFERENCE TO RELATED APPLICATIONS

The present application is a continuation of international application No. PCT/CN2019/120236, filed on Nov. 22, 2019, and entitled "DUTY CYCLE CORRECTION CIRCUIT", which is hereby incorporated by reference in its entirety.

TECHNICAL FIELD

Embodiments of the present application relate to the technical field of electronics, and in particular, relate to a duty cycle correction circuit.

BACKGROUND

In the technical field of electronics, during data transmission, clock signals and data signals are generally present. The data signal is transmitted according to a rising edge or a falling edge of the clock signal. For a higher throughput, the rising edge and the falling edge of the clock signal may be sufficiently utilized. For example, data is transmitted at both the rising edge and the falling edge of the clock signal, such that a doubled throughput may be obtained. However, during signal transmission, specific establishment time and holding time need to be ensured, and one data signal transmission is completed within this time period. Therefore, the clock signal needs to be maintained unchanged at high level or low level. If the clock signal changes, errors may occur to data transmission. Therefore, the high level and the low level of the clock signal both need to be maintained for a relatively longer time period. When a duty cycle of the clock signal is 50%, that is, the high level and the low level are maintained at equal time periods, the high level and the low level both satisfy the establishment time and the holding time. Generally, level conversion is required for the clock signal to improve amplitude. However, with respect to a clock signal output upon the level conversion, the duty cycle of the clock signal may change due to delays of the electronic devices or the like. The duty cycle may not accurately reach 50%, which affects the data transmission efficiency.

SUMMARY

In view of the above, one technical problem to be solved by embodiments of the present application is to provide a duty cycle correction circuit to overcome in the related art that the duty cycle may not reach 50% due to delays of electronic devices or the like and thus data transmission efficiency is affected.

Embodiments of the present disclosure provide a duty cycle correction circuit. The duty cycle correction circuit includes:

a first inverter including an input terminal and an output terminal, the input terminal of the first inverter being configured to receive a first signal, and the output terminal of the first inverter being configured to output a third signal, the third signal being an inverted signal of the first signal and having a first delay time relative to the first signal;

a first adjustment circuit including a first input terminal, a second input terminal, and an output terminal, the first input terminal of the first adjustment circuit being connected to the output terminal of the first inverter and configured to receive the third signal, and the output terminal of the first adjustment circuit being configured to output a first correction signal; and a first delayer, an input terminal of the first delayer being configured to input a second signal, a cycle length of the second signal being equal to that of the first signal and a phase of the second signal being different from that of the first signal by ½ of the cycle length, and an output terminal of the first delayer being connected to the second input terminal of the first adjustment circuit and configured to output a fourth signal to the first adjustment circuit, the fourth signal having the first delay time relative to the second signal;

wherein the first correction signal is at high level when the third signal and the fourth signal are at high level, and the first correction signal is at low level when the third signal and the fourth signal are at low level.

Optionally, in an embodiment of the present disclosure, the duty cycle correction circuit further includes a second inverter, a second delayer, and a second adjustment circuit; wherein the second inverter includes an input terminal and an output terminal, the input terminal of the second inverter being configured to receive the second signal, and the output terminal of the second inverter being configured to output a fifth signal, the fifth signal being an inverted signal of the second signal and having the first delay time relative to the second signal;

the second adjustment circuit includes a first input terminal, a second input terminal, and an output terminal, the first input terminal of the second adjustment circuit being connected to the output terminal of the second inverter and configured to receive the fifth signal, and the output terminal of the second adjustment circuit being configured to output a second correction signal; and the second delayer includes an input terminal and an output terminal, the input terminal of the second delayer being configured to input the first signal, and the output terminal of the second delayer being connected to the second input terminal of the second adjustment circuit and configured to output a sixth signal to the second adjustment circuit, the sixth signal having the first delay time relative to the first signal;

wherein the second correction signal is at high level when the fifth signal and the sixth signal are at high level, and the second correction signal is at low level when the fifth signal and the sixth signal are at low level.

Optionally, in an embodiment of the present disclosure, the input terminal of the first inverter is connected to the input terminal of the second delayer, and the input terminal of the second inverter is connected to the input terminal of the first delayer.

Optionally, in an embodiment of the present disclosure, the first adjustment circuit includes a first field-effect transistor, a second field-effect transistor, a third field-effect transistor, and a third inverter; wherein a gate of the first field-effect transistor is connected to the output terminal of the first inverter and configured to receive the third signal, and a drain of the first field-effect transistor is connected to a source of the second field-effect transistor;

a gate of the second field-effect transistor is connected to a gate of the third field-effect transistor, and a drain of the second field-effect transistor is connected to a drain of the third field-effect transistor;

the gate of the third field-effect transistor is connected to the output terminal of the first delayer and configured to receive the fourth signal; and an input terminal of the third inverter is connected to the drain of the third field-effect transistor, and an output terminal of the third inverter is configured to output the first correction signal.

Optionally, in an embodiment of the present disclosure, the first field-effect transistor and the second field-effect transistor are P-channel field-effect transistors, and the third field-effect transistor is an N-channel field-effect transistor.

Optionally, in an embodiment of the present disclosure, the second adjustment circuit includes a fourth field-effect transistor, a fifth field-effect transistor, a sixth field-effect transistor, and a fourth inverter; wherein a gate of the fourth field-effect transistor is connected to the output terminal of the second inverter and configured to receive the fifth signal, and a drain of the fourth field-effect transistor is connected to a source of the fifth field-effect transistor;

a gate of the fifth field-effect transistor is connected to a gate of the sixth field-effect transistor, and a drain of the fifth field-effect transistor is connected to a drain of the sixth field-effect transistor;

the gate of the sixth field-effect transistor is connected to the output terminal of the second delayer and configured to receive the sixth signal; and an input terminal of the fourth inverter is connected to the drain of the sixth field-effect transistor, and an output terminal of the fourth inverter is configured to output the second correction signal.

Optionally, in an embodiment of the present disclosure, the fourth field-effect transistor and the fifth field-effect transistor are P-channel field-effect transistors, and the sixth field-effect transistor is an N-channel field-effect transistor.

Optionally, in an embodiment of the present disclosure, the duty cycle correction circuit further includes a level conversion circuit; wherein a first input terminal of the level conversion circuit is configured to input a first initial signal, and a second input terminal of the level conversion circuit is configured to input a second initial signal, the first initial signal and the second initial signal being a differential signal; and a first output terminal of the level conversion circuit is connected to the input terminal of the first inverter and configured to input the first signal to the first inverter, and a second output terminal of the level conversion circuit is connected to the input terminal of the first delayer and configured to input the second signal to the first delayer.

Optionally, in an embodiment of the present disclosure, a rising edge of the second signal has a delay of a second time duration relative to a falling edge of the first signal, a rising edge of the first signal has the delay of the second time duration relative to a falling edge of the second signal, and the falling edge of the first signal has a delay of a third duration relative to a falling edge of the second initial signal.

Optionally, in an embodiment of the present disclosure, the level conversion circuit further includes a first booster circuit and a second booster circuit; wherein a first input terminal of the first booster circuit is configured to input the first initial signal, and an output terminal of the first booster circuit is configured to output the first signal; and a first input terminal of the second booster circuit is configured to input the second initial signal, a second input terminal of the second booster circuit is connected to the output terminal of the first booster circuit, and an output terminal of the second booster circuit is connected to a second input terminal of the first booster circuit and configured to output the second signal.

Optionally, in an embodiment of the present disclosure, the first booster circuit includes a seventh field-effect transistor, an eighth field-effect transistor, and a ninth field-effect transistor; wherein a gate of the seventh field-effect transistor is connected to a gate of the ninth field-effect transistor, and a drain of the seventh field-effect transistor is connected to a source of the eighth field-effect transistor;

a drain of the eighth field-effect transistor is connected to a drain of the ninth field-effect transistor, and a gate of the eighth field-effect transistor is connected to the output terminal of the second booster circuit; and the gate of the ninth field-effect transistor is configured to input the first initial signal, and the drain of the ninth field-effect transistor is configured to output the first signal.

Optionally, in an embodiment of the present disclosure, the seventh field-effect transistor and the eighth field-effect transistor are P-channel field-effect transistors, and the ninth field-effect transistor is an N-channel field-effect transistor.

Optionally, in an embodiment of the present disclosure, the second booster circuit includes a tenth field-effect transistor, an eleventh field-effect transistor, and a twelfth field-effect transistor; wherein a gate of the tenth field-effect transistor is connected to a gate of the twelfth field-effect transistor, and a drain of the tenth field-effect transistor is connected to a source of the eleventh field-effect transistor;

a drain of the eleventh field-effect transistor is connected to a drain of the twelfth field-effect transistor, and a gate of the eleventh field-effect transistor is connected to the output terminal of the first booster circuit; and the gate of the twelfth field-effect transistor is configured to input the second initial signal, and the drain of the twelfth field-effect transistor is configured to output the second signal.

Optionally, in an embodiment of the present disclosure, the tenth field-effect transistor and the eleventh field-effect transistor are P-channel field-effect transistors, and the twelfth field-effect transistor is an N-channel field-effect transistor.

Optionally, in an embodiment of the present disclosure, a difference between a duty cycle of the first signal and 0.5 is outside a predetermined range, and a difference between a duty cycle of the first correction signal and 0.5 is within the predetermined range.

In the duty cycle correction circuit according to the embodiments of the present disclosure, the first signal is processed by the first inverter to obtain the inverted signal of the first signal, that is, the third signal; the output first correction signal is at high level when the third signal and the fourth signal are at high level; and the output first correction signal is at low level when the third signal and the fourth signal are at low level. In this way, the delay between the rising edges of the third signal and the fourth signal, and the delay between the falling edges of the third signal and the fourth signal are eliminated, such that the duty cycle is more accurate.

BRIEF DESCRIPTION OF THE DRAWINGS

Some specific embodiments of the present disclosure are described in detail hereinafter in an exemplary fashion instead of a limiting fashion with reference to the accompanying drawings. In the drawings, like reference numerals denote like or similar parts or elements. A person skilled in the art should understand that these drawings may not be necessarily drawn to scale. Among the drawings.

DETAILED DESCRIPTION

Nevertheless, it is not necessary to require that any technical solution according to the embodiments of the present disclosure achieves all of the above technical effects.

For better understanding of the technical solutions of the embodiments of the present application by a person skilled in the art, the technical solutions of the present application are clearly and completely described with reference to the accompanying drawings of the embodiments of the present application. Apparently, the described embodiments are only a part of the embodiments of the present application, rather than the entire embodiments. Based on the embodiments of the present application, all other embodiments derived by persons of ordinary skill in the art without any creative efforts shall fall within the protection scope of the present application.

Specific implementations of the embodiments of the present disclosure are further described hereinafter with reference to the accompanying drawings of the present disclosure.

First Embodiment

Figure 1:
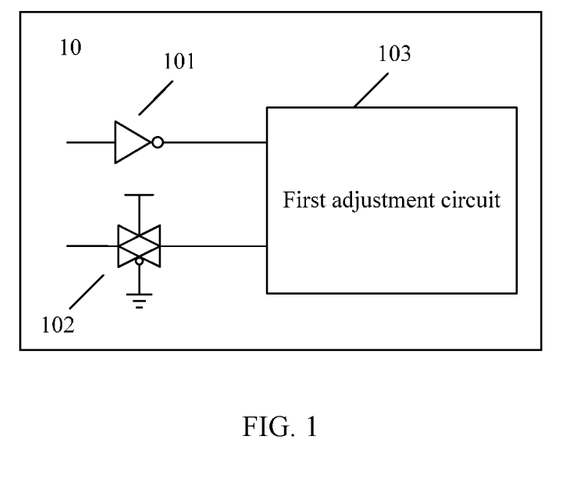
FIG. 1 is a schematic structural diagram of a duty cycle correction circuit according to a first embodiment of the present disclosure.

FIG. 1 is a schematic structural diagram of a duty cycle correction circuit 10 according to the first embodiment of the present disclosure. As illustrated in FIG. 1, the duty cycle correction circuit 10 includes: a first inverter 101, a first delayer 102, and a first adjustment circuit 103.

The first inverter 101 includes an input terminal and an output terminal. The input terminal of the first inverter 101 is configured to receive a first signal, and the output terminal of the first inverter 101 is configured to output a third signal. The third signal is an inverted signal of the first signal and has the first delay time relative to the first signal.

The first adjustment circuit 103 includes a first input terminal, a second input terminal, and an output terminal. The first input terminal of the first adjustment circuit 103 is connected to the output terminal of the first inverter 101 and configured to receive the third signal, and the output terminal of the first adjustment circuit 103 is configured to output a first correction signal.

An input terminal of the first delayer 102 is configured to input a second signal, where a cycle length of the second signal equal to that of the first signal and a phase of the second signal is different from that of the first signal by ½ of the cycle length. The output terminal of the first delayer 102 is connected to the second input terminal of the first adjustment circuit 103 and configured to output a fourth signal to the first adjustment circuit 103. The fourth signal has the first delay time relative to the second signal.

The first correction signal is at high level when the third signal and the fourth signal are at high level, and the first correction signal is at low level when the third signal and the fourth signal are at low level.

The first signal is a signal whose duty cycle is to be adjusted, and the output terminal of the first adjustment circuit 103 is the first output terminal of the duty cycle correction circuit 10. Optionally, in an embodiment of the present disclosure, a difference between a duty cycle of the first signal and 0.5 is outside a predetermined range, and a difference between a duty cycle of the first correction signal and 0.5 is within the predetermined range. For example, the predetermined range may be [−0.1, 0.1], or may be [−0.05, 0.05]. Nevertheless, these value ranges are only examples, which are not intended to limit the present disclosure. In one implementation, the duty cycle of the first correction signal is equal to 0.5.

Figure 2:
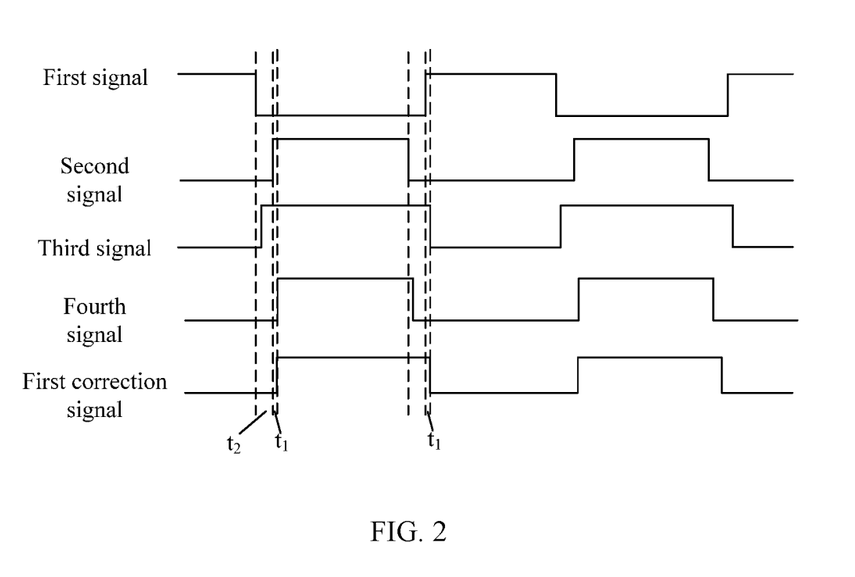
FIG. 2 is a signal timing diagram according to the first embodiment of the present disclosure.

FIG. 2 is a signal timing diagram according to the first embodiment of the present disclosure. As illustrated in FIG. 2, the first signal is a signal whose duty cycle is to be adjusted. In the present disclosure, the first signal and the second signal both have a cycle length of T, and a time length when the first signal is maintained at low level is greater than ½ of the cycle length by a second time duration $t_2$. That is, a falling edge of the first signal is delayed by the second time duration, such that the duty cycle of the first signal is not equal to 50%. That is, the time lengths when the high level and low level are maintained within a cycle length are not equal. The phase difference between the second signal and the first signal is ½ of the cycle length, and the second signal may be the same as the first signal when the second signal is shifted forward or backward by a time length that is ½ of the cycle length. Therefore, the low level of the first signal corresponds to the high level of the second signal. Further, since the time length when the low level of the first signal is maintained is greater than the time length when the high level is maintained by 2 times of the second time duration, a rising edge of the second signal is delayed by the second time duration relative to a falling edge of the first signal, a rising edge of the first signal is delayed by the second time duration relative to a falling edge of the second signal. The first signal is processed by using the first inverter 101 to obtain the third signal. The third signal is the inverted signal of the first signal. Due to the processing time of the inverter, a rising edge of the third signal is delayed by the first delay time $t_1$ relative to the falling edge of the first signal. Therefore, for consistency with the third signal, the second signal is delayed by the first delay time to obtain the fourth signal. The third signal is compared with the fourth signal. Since the third signal is obtained by delaying the inverted signal of the second signal by the first delay time, the high level of the third signal corresponds to the high level of the fourth signal, and the low level of the third signal corresponds to the low level of the fourth signal. Since the third signal is delayed by the first delay time relative to the first signal, and the fourth signal is delayed by the first delay time relative to the second signal, a rising edge of the fourth signal (corresponding to the rising edge of the second signal) is delayed by the second time duration relative to the rising edge of the third signal (corresponding to the falling edge of the first signal), and a falling edge of the third signal (corresponding to the rising edge of the first signal) is delayed by the second time duration relative to a falling edge of the fourth signal (corresponding to the falling edge of the second signal). The time length when the high level of the third signal is maintained is T/2+t2. Therefore, when the third signal and the fourth signal are at high level, the output first correction signal is at high level, that is, a rising edge of the fourth signal is made to correspond to a rising edge of the first correction signal. When the third signal and the fourth signal are at low level, the output first correction signal is at low level, that is, the falling edge of the third signal is made to correspond to a falling edge of the first correction signal, a time length from the rising edge of the fourth signal to the falling edge of the third signal is T/2, and the delay between the rising edges of the third signal and the fourth signal is eliminated, such that a more accurate duty cycle is obtained.

In the duty cycle correction circuit 10 according to the embodiments of the present disclosure, the first signal is processed by the first inverter 101 to obtain the inverted signal of the first signal, that is, the third signal; the output first correction signal is at high level when the third signal and the fourth signal are at high level; and the output first correction signal is at low level when the third signal and the fourth signal are at low level. In this way, the delay between the rising edges of the third signal and the fourth signal, and the delay between the falling edges of the third signal and the fourth signal is eliminated, such that the duty cycle is more accurate.

Second Embodiment

Figure 3:
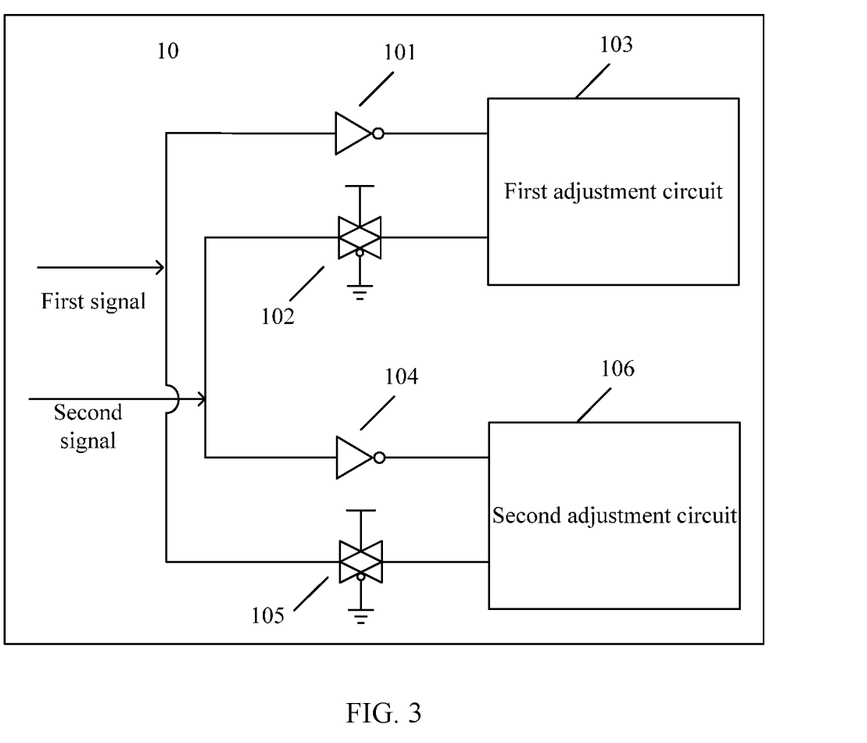
FIG. 3 is a schematic structural diagram of a duty cycle correction circuit according to a second embodiment of the present disclosure.

On the basis of the duty cycle correction circuit according to the first embodiment, FIG. 3 is a schematic structural diagram of a duty cycle correction circuit 10 according to the second embodiment of the present disclosure. Optionally, in an embodiment of the present disclosure, the duty cycle correction circuit 10 further includes a second inverter 104, a second delayer 105, and a second adjustment circuit 106.

The second inverter 104 includes an input terminal and an output terminal. The input terminal of the second inverter 104 is configured to receive the second signal, and the output terminal of the second inverter 104 is configured to output a fifth signal. The fifth signal is an inverted signal of the second signal and has the delay of the first delay time duration relative to the second signal.

The second adjustment circuit 106 includes a first input terminal, a second input terminal, and an output terminal. The first input terminal of the second adjustment circuit 106 is connected to the output terminal of the second inverter 104 and configured to receive the fifth signal, and the output terminal of the second adjustment circuit 106 is configured to output a second correction signal.

The second delayer 105 includes an input terminal and an output terminal. The input terminal of the second delayer 105 is configured to input the first signal, and the output terminal of the second delayer 105 is connected to the second input terminal of the second adjustment circuit 106 and configured to output a sixth signal to the second adjustment circuit 106. The sixth signal has the delay of the first delay time relative to the first signal.

The second correction signal is at high level when the fifth signal and the sixth signal are at high level, and the second correction signal is at low level when the fifth signal and the sixth signal are at low level.

The second signal is a signal whose duty cycle is to be adjusted, and the output terminal of the second adjustment circuit 105 is the second output terminal of the duty cycle correction circuit 10. Optionally, in an embodiment of the present disclosure, a difference between a duty cycle of the second signal and 0.5 is outside a predetermined range, and a difference between a duty cycle of the second correction signal and 0.5 is within the predetermined range. In one implementation, the duty cycle of the second correction signal is equal to 0.5.

Optionally, in an embodiment of the present disclosure, the input terminal of the first inverter 101 is connected to the input terminal of the second delayer 105, and the input terminal of the second inverter 104 is connected to the input terminal of the first delayer 102.

Figure 4:
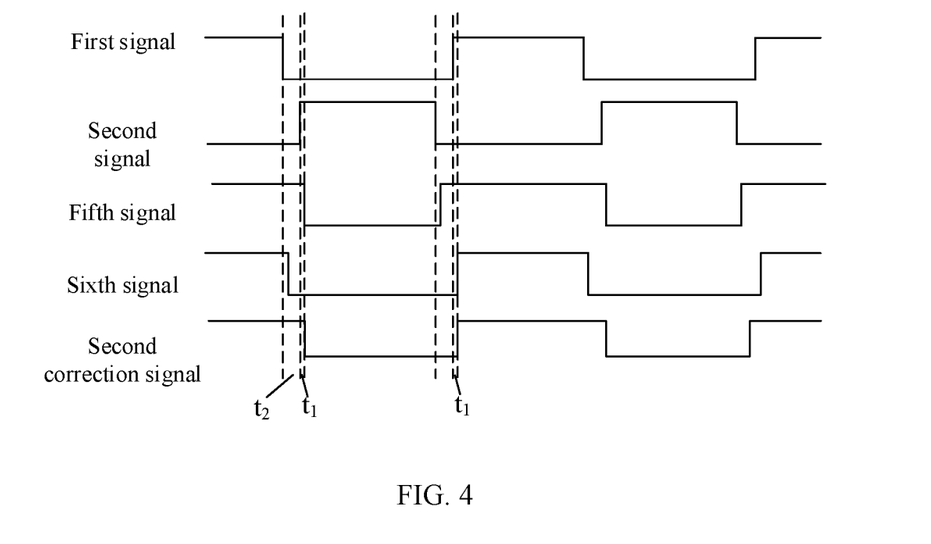
FIG. 4 is a signal timing diagram according to the second embodiment of the present disclosure.

In the second embodiment, by taking the second signal as the signal whose duty cycle is to be adjusted, referring to FIG. 4, FIG. 4 is a signal timing diagram according to the second embodiment of the present disclosure. As illustrated in FIG. 4, the rising edge of the second signal is delayed by the second time duration $t_2$ relative to the falling edge of the first signal, the second signal is processed by the first inverter 101 to obtain the fifth signal. The fifth signal is the inverted signal of the second signal. Due to the processing time of the inverter, a rising edge of the fifth signal is delayed by the first delay time $t_1$ relative to the falling edge of the second signal. Therefore, for consistency with the fifth signal, the first signal is delayed by the first delay time to obtain the sixth signal. The fifth signal is compared with the sixth signal. Since the fifth signal is obtained by delaying the inverted signal of the second signal by the first delay time, the high level of the fifth signal corresponds to the high level of the sixth signal, and the low level of the fifth signal corresponds to the low level of the sixth signal. Since the fifth signal is delayed by the first delay time relative to the second signal, and the sixth signal is delayed by the first delay time relative to the first signal, a falling edge of the fifth signal (corresponding to the rising edge of the second signal) is delayed by the second time duration relative to a falling edge of the sixth signal (corresponding to the falling edge of the first signal), and the rising edge of the fifth signal (corresponding to the falling edge of the second signal) is delayed by the second time duration relative to a rising edge of the sixth signal (corresponding to the rising edge of the first signal). The time length when the high level of the fifth signal is maintained is T/2+t2. Therefore, when the fifth signal and the sixth signal are at high level, the output second correction signal is at high level, that is, the rising edge of the sixth signal is made to correspond to a rising edge of the second correction signal. When the fifth signal and the sixth signal are at low level, the output second correction signal is at low level, that is, the falling edge of the fifth signal is made to correspond to a falling edge of the second correction signal, a time length from the rising edge of the sixth signal to the falling edge of the fifth signal is T/2, and a delay between the rising edges of the fifth signal and the sixth signal is eliminated, such that a more accurate duty cycle is obtained.

Third Embodiment

Figure 5:
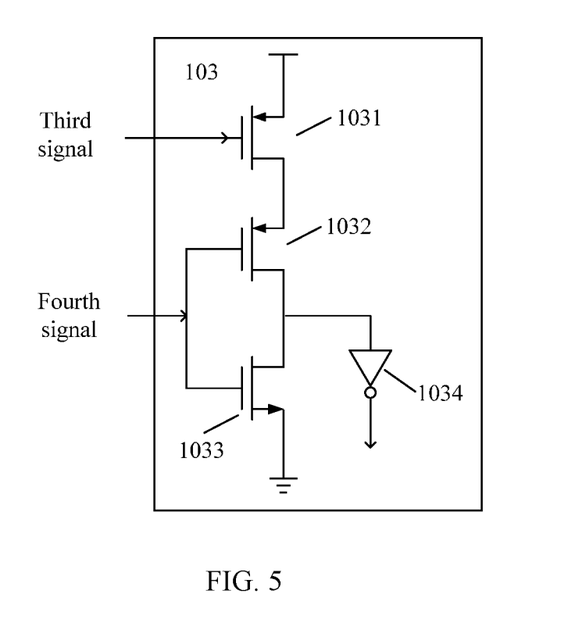
FIG. 5 is a schematic structural diagram of a first adjustment circuit according to a third embodiment of the present disclosure.

On the basis of the duty cycle correction circuit according to the first embodiment, FIG. 5 is a schematic structural diagram of a first adjustment circuit 103 according to the third embodiment of the present disclosure. Optionally, in an embodiment of the present disclosure, the first adjustment circuit 103 includes a first field-effect transistor 1031, a second field-effect transistor 1032, a third field-effect transistor 1033, and a third inverter 1034.

A gate of the first field-effect transistor 1031 is connected to the output terminal of the first inverter 101 and configured to receive the third signal, and a drain of the first field-effect transistor 1031 is connected to a source of the second field-effect transistor 1032.

A gate of the second field-effect transistor 1032 is connected to a gate of the third field-effect transistor 1033, and a drain of the second field-effect 1032 transistor is connected to a drain of the third field-effect transistor 1033.

The gate of the third field-effect transistor 1033 is connected to the output terminal of the first delayer 102 and configured to receive the fourth signal.

An input terminal of the third inverter 1034 is connected to the drain of the third field-effect transistor 1033, and an output terminal of the third inverter 1034 is configured to output the first correction signal.

The gate of the first field-effect transistor 1031 is the first input terminal of the first adjustment circuit 103, and the gate of the second field-effect transistor 1032 is the second input terminal of the first adjustment circuit 103. Since the gate of the second field-effect transistor 1032 is connected to the gate of the third field-effect transistor 1033, the gate of the third field-effect transistor 1033 is also the second input terminal of the first adjustment circuit 103, and the output terminal of the third inverter 1034 is the output terminal of the first adjustment circuit 103.

Optionally, in an embodiment of the present disclosure, the first field-effect transistor 1031 and the second field-effect transistor 1032 are P-channel field-effect transistors, and the third field-effect transistor 1033 is an N-channel field-effect transistor.

Figure 6:
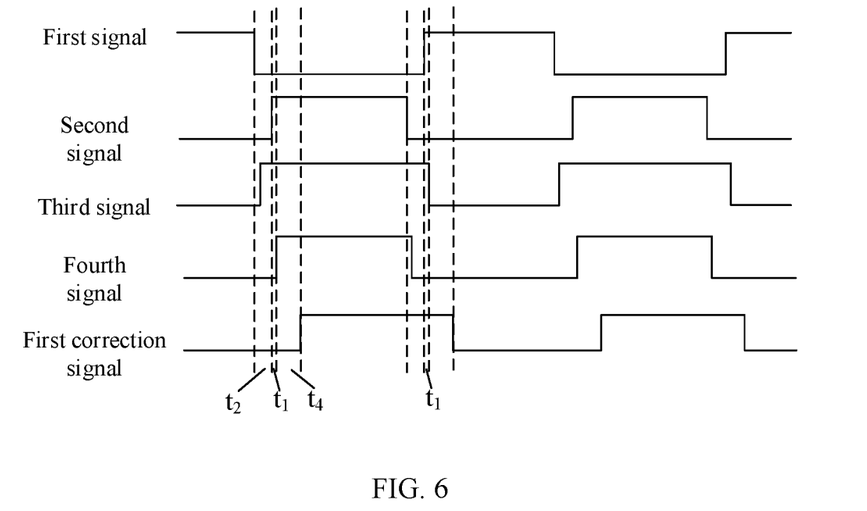
FIG. 6 is a signal timing diagram according to the third embodiment of the present disclosure.

FIG. 6 is a signal timing diagram according to the third embodiment of the present disclosure. With reference to FIG. 5 and FIG. 6, by taking the scenario where the first field-effect transistor 1031 and the second field-effect transistor 1032 are P-channel field-effect transistors, and the third field-effect transistor 1033 is an N-channel field-effect transistor as an example, the third signal is input to the gate of the first field-effect transistor 1031, the fourth signal is input to the gate of the second field-effect transistor 1032 and the gate of the third field-effect transistor 1033, and when the third signal and the fourth signal are at low level, the gate of the first field-effect transistor 1031 is at low level, and the first field-effect transistor 1031 is a P-channel field-effect transistor and is turned on at low level; when the fourth signal is at low level, the gate of the second field-effect transistor 1032 is at low level, and the second field-effect transistor 1032 is a P-channel field-effect transistor and is turned on at low level. Therefore, when the drain of the second field-effect transistor 1032 is at high level, and the fourth signal is at low level, the gate of the third field-effect transistor 1033 is at low level, and the third field-effect transistor 1033 is an N-channel field-effect transistor and is turned off at low level. In this case, the high level of the drain of the second field-effect transistor 1032 is inverted by the inverter, such that the first correction signal is output at low level.

When the third signal changes from low level to high level, and the fourth signal is at low level, the gate of the first field-effect transistor 1031 changes to high level, the first field-effect transistor 1031 changes from ON to OFF, and the fourth signal is at low level. Therefore, the gate of the second field-effect transistor 1032 is at low level, the second field-effect transistor 1032 is still in ON state, the gate of the third field-effect transistor 1033 is at low level, and the third field-effect transistor 1033 is still in OFF state. In this case, the drain of the second field-effect transistor 1032 is kept at high level, and the first correction signal is output at low level upon inversion by the inverter.

When the third signal is at high level, and the fourth signal changes from low level to high level, the gate of the first field-effect transistor 1031 and the gate of the second field-effect transistor 1032 are both at high level, and the first field-effect transistor 1031 and the second field-effect transistor 1032 are both in OFF state. Therefore, the drain of the second field-effect transistor 1032 changes from high level to low level, the third field-effect transistor 1033 changes to ON state, and the drain of the second field-effect transistor 1032 is inverted by the inverter, such that the first correction signal is output at high level. When the third signal and the fourth signal are both at high level, the first correction signal is at high level. However, since the rising edge of the fourth signal is later than the rising edge of the third signal, when the fourth signal changes from low level to high level, the first correction signal may change from low level from high level. Due to the delay of the second field-effect transistor 1032, the rising edge of the first correction signal is delayed by a fourth duration relative to the rising edge of the fourth signal. Analogously, since the falling edge of the third signal is later than the falling edge of the fourth signal, when the third signal changes from high level to low level, the first correction signal may change from high level to low level.

Fourth Embodiment

Figure 7:
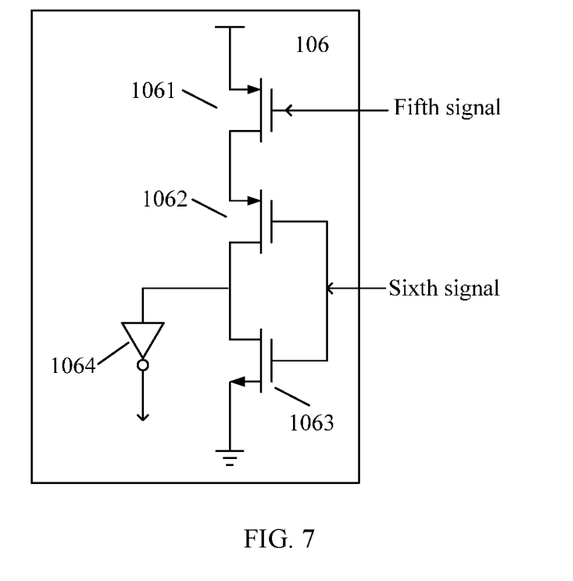
FIG. 7 is a schematic structural diagram of a second adjustment circuit according to a fourth embodiment of the present disclosure.

On the basis of the duty cycle correction circuits according to the first embodiment and the second embodiment, FIG. 7 is a schematic structural diagram of a second adjustment circuit 106 according to the fourth embodiment of the present disclosure. Optionally, in an embodiment of the present disclosure, the second adjustment circuit 106 includes a fourth field-effect transistor 1061, a fifth field-effect transistor 1062, a sixth field-effect transistor 1063, and a fourth inverter 1064.

A gate of the fourth field-effect transistor 1061 is connected to the output terminal of the second inverter 104 and configured to receive the fifth signal, and a drain of the fourth field-effect transistor 1061 is connected to a source of the fifth field-effect transistor 1062.

A gate of the fifth field-effect transistor 1062 is connected to a gate of the sixth field-effect transistor 1063, and a drain of the fifth field-effect transistor 1062 is connected to a drain of the sixth field-effect transistor 1063.

The gate of the sixth field-effect transistor 1063 is connected to the output terminal of the second delayer 105 and configured to receive the sixth signal.

An input terminal of the fourth inverter 1064 is connected to the drain of the sixth field-effect transistor 1063, and an output terminal of the fourth inverter 1064 is configured to output the second correction signal.

The gate of the fourth field-effect transistor 1061 is the first input terminal of the second adjustment circuit 106, and the gate of the fifth field-effect transistor 1062 is the second input terminal of the second adjustment circuit 106. Since the gate of the fifth field-effect transistor 1062 is connected to the gate of the sixth field-effect transistor 1063, the gate of the sixth field-effect transistor 1063 is also the second input terminal of the second adjustment circuit 106, and the output terminal of the fourth inverter 1064 is the output terminal of the second adjustment circuit 106.

Optionally, in an embodiment of the present disclosure, the fourth field-effect transistor 1061 and the fifth field-effect transistor 1062 are P-channel field-effect transistors, and the sixth field-effect transistor 1063 is an N-channel field-effect transistor.

Figure 8:
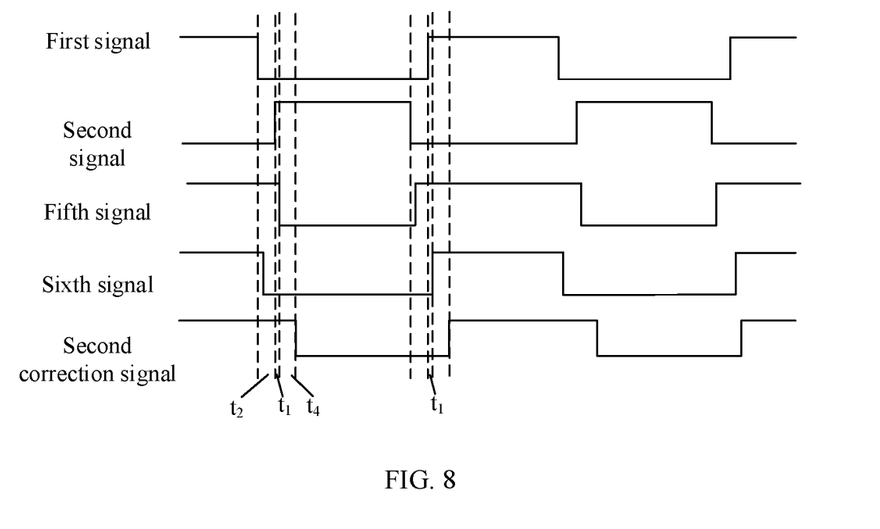
FIG. 8 is a signal timing diagram according to the fourth embodiment of the present disclosure.

FIG. 8 is a signal timing diagram according to the fourth embodiment of the present disclosure. With reference to FIG. 7 and FIG. 8, by taking the scenario where the fourth field-effect transistor 1061 and the fifth field-effect transistor 1062 are P-channel field-effect transistors, and the sixth field-effect transistor 1063 is an N-channel field-effect transistor as an example, the fifth signal is input to the gate of the fourth field-effect transistor 1061, the sixth signal is input to the gate of the fifth field-effect transistor 1062 and the gate of the sixth field-effect transistor 1063, and when the fifth signal and the sixth signal are at high level, the gate of the fourth field-effect transistor 1061 and the gate of the fifth field-effect transistor 1062 are at high level, the fourth field-effect transistor 1061 and the fifth field-effect transistor 1062 are turned off, the drain of the fifth field-effect transistor 1062 is at low level, and the sixth field-effect transistor 1063 is turned on. In this case, the low level of the drain of the fifth field-effect transistor 1062 is inverted by the inverter, such that the second correction signal is output at high level.

When the sixth signal changes from high level to low level, and the fifth signal is still at high level, the gate of the fifth field-effect transistor 1062 changes to low level, the fifth field-effect transistor 1062 changes from OFF to ON, the fourth field-effect transistor 1061 is still in OFF state, the gate of the sixth field-effect transistor 1063 changes from high level to low level, and the sixth field-effect transistor 1063 changes from ON to OFF. In this case, the drain of the fifth field-effect transistor 1062 is kept at low level, and the first correction signal is output at high level upon inversion by the inverter.

When the sixth signal is at low level, and the fifth signal changes from high level to low level, the gate of the fourth field-effect transistor 1061 changes form high level to low level, the fourth field-effect transistor 1061 changes from OFF to ON, and the fifth field-effect transistor 1062 is kept in ON state. Therefore, the drain of the fifth field-effect transistor 1062 changes from low level to high level, the sixth field-effect transistor 1063 is kept in OFF state, and the high level of the drain of the fifth field-effect transistor 1062 is inverted by the inverter, such that the second correction signal is output at low level. When the fifth signal and the sixth signal are both at high level, the second correction signal is at high level. However, since the falling edge of the fifth signal is later than the falling edge of the sixth signal, when the fifth signal changes from high level to low level, the second correction signal may change from high level from low level. Due to the delay of the fourth field-effect transistor 1061, the falling edge of the second correction signal is delayed by the fourth duration relative to the falling edge of the fifth signal. Analogously, since the falling edge of the sixth signal is later than the rising edge of the fifth signal, when the sixth signal changes from low level to high level, the first correction signal may change from low level to high level. It should be noted that in this embodiment, a time length by which the falling edge of the second correction signal is delayed relative to the falling edge of the fifth signal may be equal to the fourth duration or may not be equal to the fourth duration. This embodiment is described using the scenario where the delay durations of the drains are equal when the field-effect transistors change from OFF to ON or change from ON to OFF. However, the present disclosure is not limited to such examples. The delay durations caused by the field-effect transistors may also be different.

Fifth Embodiment

Figure 9:
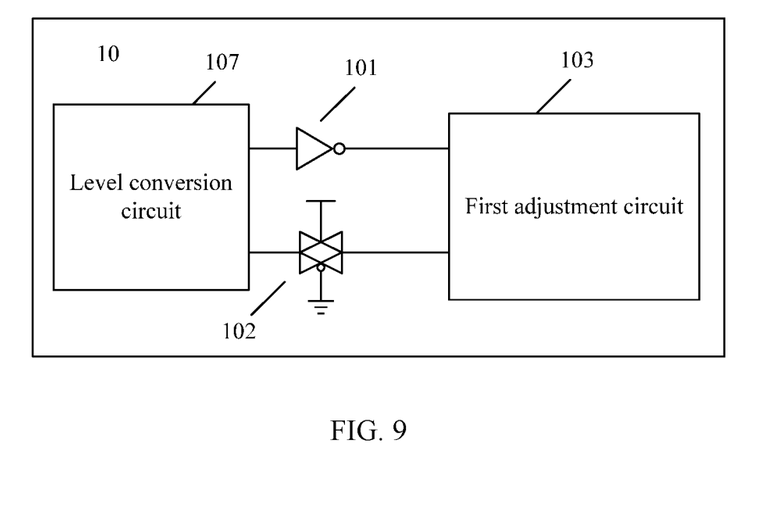
FIG. 9 is a schematic structural diagram of a duty cycle correction circuit according to a fifth embodiment of the present disclosure.

On the basis of the duty cycle correction circuit according to any of the above embodiments, FIG. 9 is a schematic structural diagram of a duty cycle correction circuit 10 according to the fifth embodiment of the present disclosure. As illustrated in FIG. 9, optionally, in an embodiment of the present disclosure, the duty cycle correction circuit 10 further includes a level conversion circuit 107.

A first input terminal of the level conversion circuit 107 is configured to input a first initial signal, and a second input terminal of the level conversion circuit 107 is configured to input a second initial signal. The first initial signal and the second initial signal are a differential signal.

A first output terminal of the level conversion circuit 107 is connected to the input terminal of the first inverter 101 and configured to input the first signal to the first inverter 101, and a second output terminal of the level conversion circuit 107 is connected to the input terminal of the first delayer 102 and configured to input the second signal to the first delayer 102.

The two signals that are a differential signal have the same amplitude and opposite phases. That is, when the first initial signal is at high level, the second initial signal is at low level; and when the first initial signal is at low level, the second initial signal is at high level. Duty cycles of the first initial signal and the second initial signal are both 50%. Nevertheless, values of the duty cycles herein are only examples.

Optionally, in an embodiment of the present disclosure, a rising edge of the second signal has a delay of a second time duration relative to a falling edge of the first signal, a rising edge of the first signal has the delay of the second time duration relative to a falling edge of the second signal, and the falling edge of the first signal has a delay of a third duration relative to a falling edge of the second initial signal.

The first initial signal and the second initial signal are processed by the level conversion circuit 107 to amplify the amplitude of the signals. However, due to the delay of the devices, that is, the third duration, the duty cycles of the first signal and the second signal are changed, which are not 50%. Herein, the working principles of the level conversion circuit 107 are described by a specific example.

Figure 10:
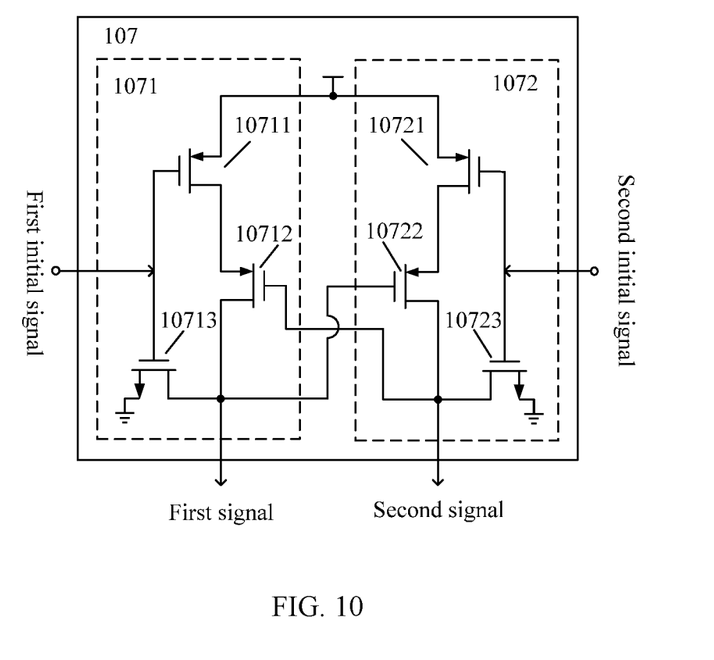
FIG. 10 is a schematic structural diagram of a level conversion circuit according to the fifth embodiment of the present disclosure.

Optionally, in an embodiment of the present disclosure, as illustrated in FIG. 10, FIG. 10 is a schematic structural diagram of a level conversion circuit 107 according to the fifth embodiment of the present disclosure. The level conversion circuit 107 includes a first booster circuit 1071 and a second booster circuit 1072.

A first input terminal of the first booster circuit 1071 is configured to input the first initial signal, and an output terminal of the first booster circuit 1071 is configured to output the first signal.

A first input terminal of the second booster circuit 1072 is configured to input the second initial signal, a second input terminal of the second booster circuit 1072 is connected to the output terminal of the first booster circuit, and an output terminal of the second booster circuit 1072 is connected to a second input terminal of the first booster circuit 1071 and configured to output the second signal.

The input terminal of the first booster circuit 1071 is the first input terminal of the level conversion circuit 107, the input terminal of the second booster circuit 1072 is the second input terminal of the level conversion circuit 107, the output terminal of the first booster circuit 10 is the first output terminal of the level conversion circuit 107, and the output terminal of the second booster circuit 1072 is the second output terminal of the level conversion circuit 107.

As illustrated in FIG. 10, optionally, in an embodiment of the present disclosure, the first booster circuit 1071 includes a seventh field-effect transistor 10711, an eighth field-effect transistor 10712, and a ninth field-effect transistor 10713.

A gate of the seventh field-effect transistor 10711 is connected to a gate of the ninth field-effect transistor 10713, and a drain of the seventh field-effect transistor 10711 is connected to a source of the eighth field-effect transistor 10712.

A drain of the eighth field-effect transistor 10712 is connected to a drain of the ninth field-effect transistor 10713, and a gate of the eighth field-effect transistor 10712 is connected to the output terminal of the second booster circuit 1072.

The gate of the ninth field-effect transistor 10713 is configured to input the first initial signal, and the drain of the ninth field-effect transistor 10713 is configured to output the first signal.

The gate of the seventh field-effect transistor 10711 is the input terminal of the first booster circuit 1071, that is, the first input terminal of the level conversion circuit 107. Since the gate of the seventh field-effect transistor 10711 is connected to the gate of the ninth field-effect transistor 10713, the gate of the ninth field-effect transistor 10713 is the input terminal of the first booster circuit 1071, that is, the first input terminal of the level conversion circuit 107; and the drain of the ninth field-effect transistor 10713 is the output terminal of the first booster circuit 1071, that is, the first output terminal of the level conversion circuit 107.

Optionally, in an embodiment of the present disclosure, the seventh field-effect transistor 10711 and the eighth field-effect transistor 10712 are P-channel field-effect transistors, and the ninth field-effect transistor 10713 is an N-channel field-effect transistor.

As illustrated in FIG. 10, optionally, in an embodiment of the present disclosure, the second booster circuit 1072 includes a tenth field-effect transistor 10721, an eleventh field-effect transistor 10722, and a twelfth field-effect transistor 10723.

A gate of the tenth field-effect transistor 10721 is connected to a gate of the twelfth field-effect transistor 10723, and a drain of the tenth field-effect transistor 10721 is connected to a source of the eleventh field-effect transistor 10722.

A drain of the eleventh field-effect transistor 10721 is connected to a drain of the twelfth field-effect transistor 10723, and a gate of the eleventh field-effect transistor 10722 is connected to the output terminal of the first booster circuit 1071.

The gate of the twelfth field-effect transistor 10723 is configured to input the second initial signal, and the drain of the twelfth field-effect transistor 10723 is configured to output the second signal.

The gate of the tenth field-effect transistor 10721 is the input terminal of the second booster circuit 1072, that is, the second input terminal of the level conversion circuit 107. Since the gate of the tenth field-effect transistor 10721 is connected to the gate of the twelfth field-effect transistor 10723, the gate of the twelfth field-effect transistor 10723 is the input terminal of the second booster circuit 1072, that is, the second input terminal of the level conversion circuit 107; and the drain of the twelfth field-effect transistor 10723 is the output terminal of the second booster circuit 1072, that is, the second output terminal of the level conversion circuit 107.

Optionally, in an embodiment of the present disclosure, the tenth field-effect transistor 10721 and the eleventh field-effect transistor 10722 are P-channel field-effect transistors, and the twelfth field-effect transistor 10723 is an N-channel field-effect transistor.

With reference to the level conversion circuit 107 as illustrated in FIG. 10, the first initial signal changes to the third signal upon processing by the level conversion circuit 107, the first signal is input to the level conversion circuit 107 such that the level amplitude is improved, the falling edge of the first signal is delayed by the third duration relative to a rising edge of the first initial signal due to the delay of the circuit, the second initial signal changes to the fourth signal upon processing by the level conversion circuit 107, the second initial signal is input to the level conversion circuit 107, and the rising edge of the fourth signal is delayed by the second time duration relative to the rising edge of the third signal due to the delay of the circuit.

Figure 11:
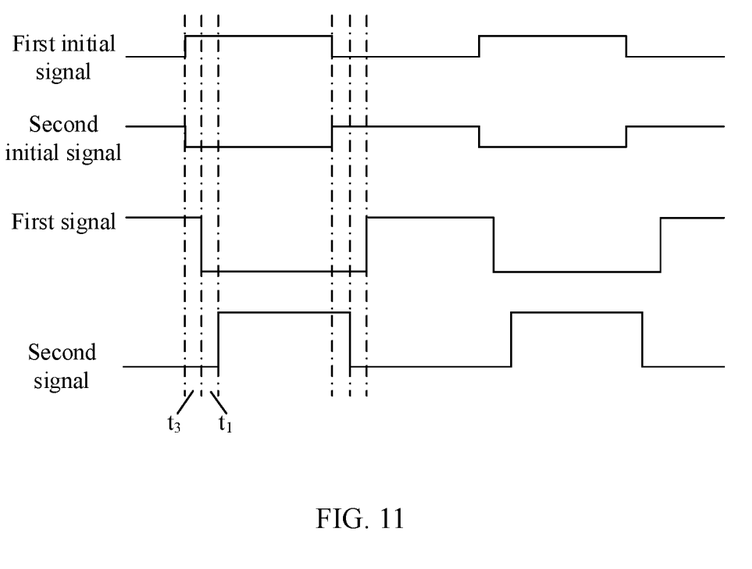
FIG. 11 is a signal timing diagram according to the fifth embodiment of the present disclosure.

FIG. 11 is a signal timing diagram according to the fifth embodiment of the present disclosure. Signal timing is described in detail with reference to FIG. 11. The description is herein given using the scenario where the seventh field-effect transistor 10711 and the eighth field-effect transistor 10712 are P-channel field-effect transistors, and the ninth field-effect transistor 10713 is an N-channel field-effect transistor as an example. The first initial signal and the second initial signal are a differential signal, and the cycle length of the first initial signal and the cycle length of the second initial signal are both T, and the duty cycles of the first initial signal and the second initial signal are both 50%.

When the first initial signal is at low level and the second initial signal is at high level, the gate of the seventh field-effect transistor 10711 is at low level and the seventh field-effect transistor 10711 is in ON state, the gate of the ninth field-effect transistor 10713 is at low level and the ninth field-effect transistor 10713 is in OFF state, and the gate of the tenth field-effect transistor 10721 is at high level and the tenth field-effect transistor 10721 is in OFF state. Therefore, the drain of the eleventh field-transistor 10722 is at low level, the gate of the eighth field-effect transistor 10712 connected to the eleventh field-transistor 10722 is at low level, the eighth field-effect transistor 10712 is turned on, the seventh field-effect transistor 10711 and the eighth field-effect transistor 10712 are both turned on, the drain of the eighth field-effect transistor 10712 is at high level and thus the first signal is output at high level, and the drain of the eleventh field-effect transistor 10722 is at low level and thus the second signal is output at low level.

When the first initial signal changes from low level to high level, and the second initial signal changes from high level to low level, the seventh field-effect transistor 10711 changes from ON to OFF, no current flows into the source of the eighth field-effect transistor 10712, and the drain of the eighth field-effect transistor 10712 changes to low level. Therefore, the first signal is output at low level, and the first signal may change to low level only upon completion of pull-down of the drain of the eighth field-effect transistor 10712. As such, the falling edge of the first signal is delayed by the third duration t3 relative to the rising edge of the first initial signal. Upon completion of pull-down of the drain of the eighth field-effect transistor 10712, the gate of the eleventh field-effect transistor 10722 may change to low level, the eleventh field-effect transistor 10722 changes from OFF to ON, the drain of the eleventh field-effect transistor 10722 output high level, and the second signal also changes from low level to high level. However, the second signal may change to high level only upon completion of pull-up of the drain of the eleventh field-effect transistor 10722. Therefore, the rising edge of the second signal is further delayed by the first delay time t1 relative to the falling edge of the first signal.

Analogously, when the first initial signal changes from high level to low level, and the second initial signal changes from low level to high level, the seventh field-effect transistor 10711 changes from OFF to ON, the tens field-effect transistor 10721 changes from ON to OFF, the twelfth field-effect transistor 10723 changes from OFF to ON, no current flows into the source of the eleventh field-effect transistor 10722, the drain of the eleventh field-effect transistor 10722 changes to low level, and the second signal changes from high level to low level. However, the second signal may change to low level only upon completion of pull-down of the drain of the eleventh field-effect transistor 10722. Therefore, the falling edge of the second signal is delayed by the third duration t3 relative to a rising edge of the second initial signal, the eighth field-effect transistor 10712 may change to ON only when the drain of the eleventh field-effect transistor 10722 changes to low level, and the first signal changes from low level to high level upon completion of pull-up of the drain of the eighth field-effect transistor 10712. Therefore, the rising edge of the first signal is delayed by the first delay time t1 relative to the falling edge of the second signal.

In the duty cycle correction circuit according to the embodiments of the present disclosure, the first signal is processed by the first inverter to obtain the inverted signal of the first signal, that is, the third signal; the output first correction signal is at high level when the third signal and the fourth signal are at high level; and the output first correction signal is at low level when the third signal and the fourth signal are at low level. In this way, the delay between the rising edges of the third signal and the fourth signal, and the delay between the falling edges of the third signal and the fourth signal is eliminated, such that the duty cycle is more accurate.

Theretofore, the specific embodiments of the subject have been described. Other embodiments fall within the scope defined by the appended claims. In some cases, the actions or operations disclosed in the claims may be performed in different sequences, and an expected result is still attainable. In addition, illustrations in the drawings do not necessarily require a specific sequence or a continuous sequence, to attain the expected result. In some embodiments, multi-task processing and parallel processing may be favorable.

In the 1990s, with respect to an improvement of a technology, it may be obviously distinguished whether the improvement is made to the hardware (for example, improvement of a diode, a transistor, a switch, and the like circuit structure) or to the software (for example, improvement on the method process). However, with the development of technologies, at present improvements made to many method processes have been deemed as direct improvements of the hardware circuit structure. The designers all obtain the corresponding hardware circuit structures by programming the improved method processes to the hardware circuits. Therefore, the improvement of a method process may also be implemented by a hardware entity module. For example, the programmable logic device (PLD), for example, the field programmable gate array (FPGA), is such an integrated circuit, and the logical functions thereof are determined by programming by the user to the device. The designers generally conduct the programming by themselves to "integrate" a digital system on a PLD, with no need to request the chip manufacturer to design and fabricate a dedicated integrated circuit chip. In addition, at present, the manual fabrication of the integrated circuit chip has not been used, and thus such programming may be implemented by using ("logic compiler") software instead, which is similar to the software compiler used for drafting of the program. The compilation of the original code also needs the specific programming language, which is referred to as Hardware Description Language (HDL). However, there are a variety of HDLs, for example, Advanced Boolean Expression Language (ABEL), Altera Hardware Description Language (AHDL), Confluence, Cornell University Programming Language (CUPL), HDCal, Java Hardware Description Language (JHDL), Lava, Lola, MyHDL, PALASM, Ruby Hardware Description Language (RHDL) and the like. The currently prevailing languages are Very-High-Speed Integrated Circuit Hardware Description Language (VHDL) and Verilog. A person skilled in the art also clear that the hardware circuit of the logic method process may be easily implemented only by logic programming the method process using the above hardware description languages, and the hardware description languages are programmed into the integrated circuit.

It should be noted that, in this specification, terms "comprises," "comprising," "has," "having," "includes," "including," "contains," "containing," or any other variation thereof, are intended to cover a non-exclusive inclusion, such that a process, method, article, or apparatus, that comprises, has, includes, contains a list of elements does not include only those elements but may include other elements not expressly listed or inherent to such process, method, article, or apparatus. On the premise of no more limitations, an element proceeded by "comprises . . . a," "has . . . a," "includes . . . a," or "contains . . . a" does not, without more constraints, preclude the existence of additional identical elements in the process, method, article, or device.

Various embodiments in the specification are described in a progressive manner. The same or similar parts between the embodiments may be referenced to each other. In each embodiment, the portion that is different from other embodiments is concentrated and described. In particular, with respect to a system embodiment, since it is substantially similar to the method embodiment, brief description is given. The related portions may be referenced to the description of the portions in the method embodiment.

Detailed above are exemplary embodiments of the present disclosure, and are not intended to limit the present disclosure. For a person skilled in the art, the present disclosure may be subject to various modifications and variations. Any modification, equivalent replacement, or improvement made without departing from the spirit and principle of the present disclosure should fall within the protection scope of the present disclosure.

REFERENCE NUMERALS AND DENOTATIONS THEREOF

10—duty cycle correction circuit; 101—first inverter;
102—first delayer; 103—first adjustment circuit;
104—second inverter; 105—second delayer;
106—second adjustment circuit; 1031—first field-effect transistor;
1032—second field-effect transistor; 1033—third field-effect transistor;

1034—third inverter; 1061—fourth field-effect transistor;
1062—fifth field-effect transistor; 1063—sixth field-effect transistor;
1064—fourth inverter; 107—level conversion circuit;
1071—first booster circuit; 1072—second booster circuit;
10711—seventh field-effect transistor; 10712—eighth field-effect transistor;
10713—ninth field-effect transistor; 10721—tenth field-effect transistor;
10722—eleventh field-effect transistor; 10723—twelfth field-effect transistor.

What is claimed is:

1. A duty cycle correction circuit, comprising:
a first inverter comprising an input terminal and an output terminal, the input terminal of the first inverter being configured to receive a first signal, and the output terminal of the first inverter being configured to output a third signal, the third signal being an inverted signal of the first signal and having a first delay time relative to the first signal;
a first adjustment circuit comprising a first input terminal, a second input terminal, and an output terminal, the first input terminal of the first adjustment circuit being connected to the output terminal of the first inverter and configured to receive the third signal, and the output terminal of the first adjustment circuit being configured to output a first correction signal; and
a first delayer, an input terminal of the first delayer being configured to receive a second signal, a cycle length of the second signal being equal to a cycle length of the first signal and a phase of the second signal being different from a phase of the first signal by ½ of the cycle length, and an output terminal of the first delayer being connected to the second input terminal of the first adjustment circuit and configured to output a fourth signal to the first adjustment circuit, the fourth signal having the first delay time relative to the second signal;
wherein the first correction signal is at a high level when the third signal and the fourth signal are at the high level, and the first correction signal is at a low level when the third signal and the fourth signal are at the low level.

2. The duty cycle correction circuit according to claim 1, further comprising: a second inverter, a second delayer, and a second adjustment circuit; wherein
the second inverter comprises an input terminal and an output terminal, the input terminal of the second inverter being configured to receive the second signal, and the output terminal of the second inverter being configured to output a fifth signal, the fifth signal being an inverted signal of the second signal and having the first delay time relative to the second signal;
the second adjustment circuit comprises a first input terminal, a second input terminal, and an output terminal, the first input terminal of the second adjustment circuit being connected to the output terminal of the second inverter and configured to receive the fifth signal, and the output terminal of the second adjustment circuit being configured to output a second correction signal; and
the second delayer comprises an input terminal and an output terminal, the input terminal of the second delayer being configured to input the first signal, and the output terminal of the second delayer being connected to the second input terminal of the second adjustment circuit and configured to output a sixth signal to the second adjustment circuit, the sixth signal having the first delay time relative to the first signal;
wherein the second correction signal is at the high level when the fifth signal and the sixth signal are at the high level, and the second correction signal is at the low level when the fifth signal and the sixth signal are at the low level.

3. The duty cycle correction circuit according to claim 2, wherein
the input terminal of the first inverter is connected to the input terminal of the second delayer, and the input terminal of the second inverter is connected to the input terminal of the first delayer.

4. The duty cycle correction circuit according to claim 1, wherein the first adjustment circuit comprises a first field-effect transistor, a second field-effect transistor, a third field-effect transistor, and a third inverter; wherein
a gate of the first field-effect transistor is connected to the output terminal of the first inverter and configured to receive the third signal, and a drain of the first field-effect transistor is connected to a source of the second field-effect transistor;
a gate of the second field-effect transistor is connected to a gate of the third field-effect transistor, and a drain of the second field-effect transistor is connected to a drain of the third field-effect transistor;
the gate of the third field-effect transistor is connected to the output terminal of the first delayer and configured to receive the fourth signal; and
an input terminal of the third inverter is connected to the drain of the third field-effect transistor, and an output terminal of the third inverter is configured to output the first correction signal.

5. The duty cycle correction circuit according to claim 4, wherein
the first field-effect transistor and the second field-effect transistor are P-channel field-effect transistors, and the third field-effect transistor is an N-channel field-effect transistor.

6. The duty cycle correction circuit according to claim 2, wherein the second adjustment circuit comprises a fourth field-effect transistor, a fifth field-effect transistor, a sixth field-effect transistor, and a fourth inverter; wherein
a gate of the fourth field-effect transistor is connected to the output terminal of the second inverter and configured to receive the fifth signal, and a drain of the fourth field-effect transistor is connected to a source of the fifth field-effect transistor;
a gate of the fifth field-effect transistor is connected to a gate of the sixth field-effect transistor, and a drain of the fifth field-effect transistor is connected to a drain of the sixth field-effect transistor;
the gate of the sixth field-effect transistor is connected to the output terminal of the second delayer and configured to receive the sixth signal; and
an input terminal of the fourth inverter is connected to the drain of the sixth field-effect transistor, and an output terminal of the fourth inverter is configured to output the second correction signal.

7. The duty cycle correction circuit according to claim 6, wherein
the fourth field-effect transistor and the fifth field-effect transistor are P-channel field-effect transistors, and the sixth field-effect transistor is an N-channel field-effect transistor.

8. The duty cycle correction circuit according to claim 1, further comprising a level conversion circuit; wherein a first input terminal of the level conversion circuit is configured to input a first initial signal, and a second input terminal of the level conversion circuit is configured to input a second initial signal, the first initial signal and the second initial signal being a differential signal; and a first output terminal of the level conversion circuit is connected to the input terminal of the first inverter and configured to input the first signal to the first inverter, and a second output terminal of the level conversion circuit is connected to the input terminal of the first delayer and configured to input the second signal to the first delayer.

9. The duty cycle correction circuit according to claim 8, wherein a rising edge of the second signal has a second delay time relative to a falling edge of the first signal, a rising edge of the first signal has the second delay time relative to a falling edge of the second signal, and the falling edge of the first signal has a third delay time relative to a falling edge of the second initial signal.

10. The duty cycle correction circuit according to claim 8, wherein the level conversion circuit comprises a first booster circuit and a second booster circuit; wherein a first input terminal of the first booster circuit is configured to input the first initial signal, and an output terminal of the first booster circuit is configured to output the first signal; and a first input terminal of the second booster circuit is configured to input the second initial signal, a second input terminal of the second booster circuit is connected to the output terminal of the first booster circuit, and an output terminal of the second booster circuit is connected to a second input terminal of the first booster circuit and configured to output the second signal.

11. The duty cycle correction circuit according to claim 10, wherein the first booster circuit comprises a seventh field-effect transistor, an eighth field-effect transistor, and a ninth field-effect transistor; wherein a gate of the seventh field-effect transistor is connected to a gate of the ninth field-effect transistor, and a drain of the seventh field-effect transistor is connected to a source of the eighth field-effect transistor;

a drain of the eighth field-effect transistor is connected to a drain of the ninth field-effect transistor, and a gate of the eighth field-effect transistor is connected to the output terminal of the second booster circuit; and the gate of the ninth field-effect transistor is configured to input the first initial signal, and the drain of the ninth field-effect transistor is configured to output the first signal.

12. The duty cycle correction circuit according to claim 11, wherein the seventh field-effect transistor and the eighth field-effect transistor are P-channel field-effect transistors, and the ninth field-effect transistor is an N-channel field-effect transistor.

13. The duty cycle correction circuit according to claim 10, wherein the second booster circuit comprises a tenth field-effect transistor, an eleventh field-effect transistor, and a twelfth field-effect transistor; wherein a gate of the tenth field-effect transistor is connected to a gate of the twelfth field-effect transistor, and a drain of the tenth field-effect transistor is connected to a source of the eleventh field-effect transistor;

a drain of the eleventh field-effect transistor is connected to a drain of the twelfth field-effect transistor, and a gate of the eleventh field-effect transistor is connected to the output terminal of the first booster circuit; and the gate of the twelfth field-effect transistor is configured to input the second initial signal, and the drain of the twelfth field-effect transistor is configured to output the second signal.

14. The duty cycle correction circuit according to claim 13, wherein the tenth field-effect transistor and the eleventh field-effect transistor are P-channel field-effect transistors, and the twelfth field-effect transistor is an N-channel field-effect transistor.

15. The duty cycle correction circuit according to claim 1, wherein a difference between a duty cycle of the first signal and 0.5 is outside a predetermined range, and a difference between a duty cycle of the first correction signal and 0.5 is within the predetermined range.

* * * * *